United States Patent [19]

Tuchiya et al.

[11] Patent Number: 4,654,113
[45] Date of Patent: Mar. 31, 1987

[54] PROCESS FOR FABRICATING A SEMICONDUCTOR DEVICE

[75] Inventors: Takahiro Tuchiya, Yokohama; Kazuaki Tukuda; Tadakazu Takada, both of Kawasaki; Hiroshi Goto, Yokohama, all of Japan

[73] Assignee: Fujitsu Limited, Kawasaki, Japan

[21] Appl. No.: 698,901

[22] Filed: Feb. 6, 1985

[30] Foreign Application Priority Data

Feb. 10, 1984 [JP] Japan .................. 59-21835
Oct. 24, 1984 [JP] Japan .................. 59-223351

[51] Int. Cl.⁴ .................. B44C 1/22; C03C 15/00; C03C 25/06
[52] U.S. Cl. .................. 156/643; 29/591; 156/644; 156/646; 156/653; 156/657; 156/659.1; 156/668; 156/904; 156/661.1; 427/90
[58] Field of Search ........ 156/643, 644, 646, 650-653, 156/656, 657, 659.1, 661.1, 668, 964; 204/164, 192 EC, 192 E; 427/38, 39, 88-91; 357/71; 29/590, 591; 252/79.1

[56] References Cited

U.S. PATENT DOCUMENTS 4,451,326 5/1984 Gwozdz .................. 156/657 X

Primary Examiner—William A. Powell
Attorney, Agent, or Firm—Staas & Halsey

[57] ABSTRACT

A method of forming an insulating layer having a planar surf on a lower wiring layer having given patterns steps at the shoulders of the patterns. On a lower wiring layer, a lower insulating layer is formed and a heat resistive material is coated over the lower insulative layer to form a substantially a planar top surface and to fill cavities appearing in the surface of the lower insulating layer with the material. Then, etching is carried out to preserve the profile of the surface of the coating layer and to remove the coating layer at portions where through-holes are to be formed. Any cavities in the surface of the lower insulating layer remain filled with the material after etching. An upper insulating layer is deposited on the exposed lower insulating layer and the remaining part of the coating layer. Through-holes and an upper wiring layer of given patterns are formed so that the upper wiring layer has no contact with the remaining part of the coating layer and so that the remaining part of the coating layer is never externally exposed.

17 Claims, 7 Drawing Figures

PROCESS FOR FABRICATING A SEMICONDUCTOR DEVICE

BACKGROUND OF THE INVENTION

1. Field of the Invention

The present invention relates to a process for fabricating a semiconductor device. More specifically, it relates to a process for fabricating a multilayer interconnection structure of a semiconductor device.

2. Description of the Related Art

At present, a typical multilayer interconnection structure of a semiconductor device, such as for integrated circuits (IC), is fabricated in the following manner. For example, an aluminum alloy is deposited onto a selectively surface-oxidized silicon semiconductor bulk or substrate and patterned to form a lower wiring layer having patterns. Phospho-silicate glass (PSG) is then deposited onto the lower wiring layer and the exposed bulk by chemical vapor deposition (CVD) to form an insulating layer. After the necessary through-holes are opened in the insulating layer, an aluminum alloy is again deposited onto the insulating layer and in the through-holes and patterned to form an upper wiring layer having patterns electrically connected with the lower wiring layer through the through-holes.

In such a process, the lower wiring layer has abrupt steps at the shoulders of the patterns and narrow grooves between adjacent patterns in the same proximity. These steps and grooves cause insufficient coverage of the upper wiring layer on the insulating layer, since the insulating layer also has steps and grooves or cavities corresponding to those of the lower wiring layer. Such insufficient coverage of the upper wiring layer results in a decreased thickness and possible breakage of the upper wiring layer and causes migration and melting (resulting in breakage) of the upper wiring layer due to a concentration of the current.

To prevent such insufficient coverage of an upper wiring layer, a planarization process has been proposed in which, after forming the PSG insulating layer, a resin is coated onto the PSG insulating layer, thus planarizing the top surface of the insulating layer. In this process, however, an upper wiring layer is formed on the resin layer and, therefore, the material of the upper wiring layer, such as an aluminum alloy, is placed in contact with the resin layer just under the upper wiring layer and at the through-holes, thereby deteriorating the material of the upper wiring layer due to a chemical reaction between the upper wiring layer and the resin layer. Further, exposed portions of the resin layer are subjected to contact with chemicals or gases in later processes, causing cracks and etching etc. of the resin layer. These problems make the process unsuitable for practical use.

A process for planarizing a PSG layer on a polysilicon wiring layer is described by A. C. Adams and C. D. Capio, in the paper "Planarization of Phosphorus-Doped Silicon Dioxide" (J. Electrochem. Soc., Vol. 128, No. 2, February 1981). In this process, an organic material such as a photoresist is coated on a PSG layer to form a sacrificial layer having a relatively smooth top surface, and then etched using conditions in which the organic material and the PSG are etched at nearly the same rates, thereby maintaining the original profile of the coating material, leaving the PSG surface with only smooth, gentle steps. This process necessitates the use of a relatively thick PSG layer so as to at least fill the spaces between lower wiring layers. Such a thick PSG layer cannot be made without forming vacancies (spaces or gaps) therein. Formation of vacancies in the PSG layer may occur above the portions where two patterns of the lower wiring layer are spaced in the same proximity, and sometimes above near abrupt steps of the lower wiring layer. When etching for planarization is finished, vacancies may be opened at the top surface of the etched PSG layer, leaving open cavities and steps. Thus, insufficient coverage of an upper wiring layer when formed on the PSG layer having such cavities and steps again occurs. Further, the organic material such as a photoresist may enter the vacancies and remain there after the etching is completed, leaving organic material exposed on the top surface of the PSG layer. This exposed organic material may give rise to the same problems as mentioned previously. Thus, this planarization process is also insufficient for practical use.

SUMMARY OF THE INVENTION

An object of the present invention is to provide good coverage of an upper wiring layer of given patterns, formed on an insulating layer in a multilayer interconnection structure.

Another object of the present invention is to reduce abrupt steps of an insulating layer on which an upper wiring layer is to be formed in a multilayer interconnection structure; that is, to provide an insulating layer with a substantially planar, smooth top surface when formed on a lower wiring layer having given patterns.

A further object of the present invention is to remove problems caused by an organic material remaining on the surface of an insulating layer on which an upper wiring layer is formed.

These and other objects, features and advantages of the present invention are attained by a process for fabricating a semiconductor device, comprising the steps of: forming a lower wiring layer of given patterns on a substrate; forming a lower insulating layer on the lower wiring layer and the exposed substrate; forming a layer of a heat resisting material on the lower insulating layer by coating, thereby filling cavities appearing in the top surface of the lower insulating layer with the heat resisting material and giving a substantially planular top surface to the coating layer; etching the coating layer and, if necessary, a part of the lower wiring layer, until a portion of the coating layer on at least a part of the lower wiring layer is completely removed, whereby the cavities remaining after the etching remain filled with the heat resisting material, and the resultant top surface after the etching is substantially planar; forming an upper insulating layer on the lower insulating layer and the remaining heat resisting material; forming through-holes passing through the upper and lower insulating layers and reaching the lower wiring layer in areas where the heat resisting material is completely removed by the etching; and forming an upper wiring layer of given patterns on the upper insulating layer and in the through-holes, the upper wiring layer being electrically connected with the lower wiring layer via the through-holes.

BRIEF DESCRIPTION OF THE DRAWINGS

The preferred embodiments of the present invention are described below with reference to the drawings, in which.

DESCRIPTION OF THE PREFERRED EMBODIMENTS

The description of a preferred embodiment of the present invention is made with reference to FIGS. 1A to 1F.

Figure 1A:
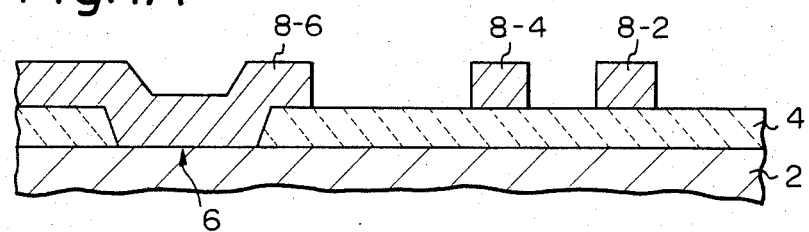
FIGS. 1A to 1F are partial sectional views of a semiconductor device during fabrication thereof by a process according to the present invention.

Referring to FIG. 1A, a semiconductor bulk or substrate 2, for example, a silicon semiconductor bulk, has an insulation layer 4, for example, a silicon dioxide ($SiO_2$) layer, on the surface of the bulk 2. The insulating layer 4 is selectively formed and a portion 6 of the bulk 2 is exposed. Such an $SiO_2$ layer 4 may be formed by, e.g., CVD or selective oxidization of the surface of the silicon bulk 2. A lower wiring layer of given patterns 8-2, 8-4, and 8-6 is formed on the $SiO_2$ layer and the exposed portion 6 of the bulk 2. The lower wiring layer has a typical thickness of approximately 1 micrometer ($\mu$m) and a typical line pattern width of approximately 4 micrometers. For example, some patterns 8-2 and 8-4 of the lower wiring layer are spaced at a distance of approximately 1.5 micrometers. A pattern 8-6 of the lower wiring layer is not a line and has a width wider than the typical width of a line of approximately 4 micrometers, e.g., 14 micrometers. The lower wiring layer may be formed of aluminum, an aluminum silicon alloy (for example, 1% silicon), an aluminum copper alloy (for example, 1% copper), gold, tungsten, or any other metal, or a conductive semiconductor such as doped poly-silicon, or of a multilayer such as titanium tungstenide-aluminium. However, the material and patterns of the lower wiring layer are not limited to the above.

Figure 1B:
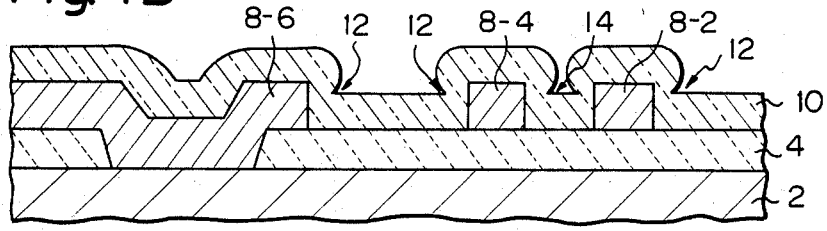

Referring to FIG. 1B, for example, PSG is deposited onto the lower wiring layer having patterns 8-2, 8-4, and 8-6 and the exposed $SiO_2$ layer 4 to form a lower insulating layer 10 having a thickness of approximately 0.7 micrometer by CVD. That is, the thickness of the lower insulating layer may be relatively thin in comparison to the prior art mentioned previously. A lower insulating layer 10 such as a PSG layer formed by CVD etc. in a conventional process does not have good coverage at portions where steps are formed by the thickness of the patterns of the lower wiring layer and at narrow groove-like portions formed by patterns in the same proximity. As seen in FIG. 1B, insufficient coverage of the lower insulating layer 10 results in recesses or cavities 12 near the steps and a recess or cavity 14 between patterns 8-2 and 8-4 in the same proximity. Accordingly, the top surface of the insulating layer 10 is not planar and has abrupt steps and cavities. If an insulating layer on the lower wiring layer having patterns 8-2, 8-4, and 8-6 is formed to a thickness greater than that shown in FIG. 1B, as in the prior art planarization process mentioned previously, the recess or cavity 14 and even the recesses or cavities 12 may grow and become closed pores or vacancies in the thick insulating layer.

A thickness of a lower insulating layer according to the present invention is preferably less than half the shortest distance between adjacent patterns of the lower wiring layer. If the former is more than the latter, a closed pore or vacancy may be formed in the lower insulating layer at least between the narrowest adjacent patterns.

A lower insulating layer 10 may be of $SiO_2$ or PSG formed by CVD, sputtering or bias sputtering, or SiN or SiON formed by plasma CVD, or the like.

Figure 1C:
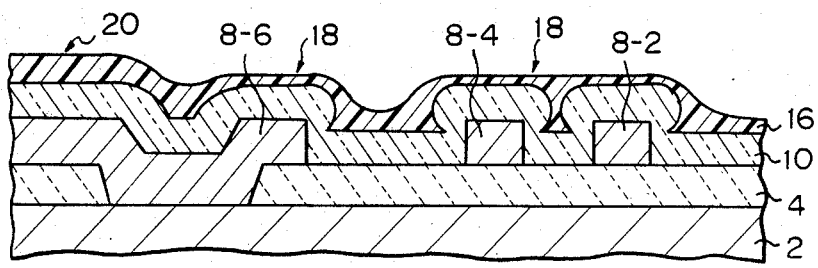

Referring to FIG. 1C, a layer 16 of a heat resisting material is coated over the lower insulating layer 10. The heat resisting material should be able to be applied as a coat, especially by spin coating, in such a manner that the top surface of the coating layer 16 of the heat resisting material becomes substantially planar and smooth, having no abrupt steps, and so that the material enters and fills the recesses or cavities 12 and 14. The heat resisting material should be resistant to temperatures used in later procedures. Preferably, the material should be resistant to a temperature of approximately 500° C.

The resultant thickness of the layer 16 will not be uniform, and the thickness will be relatively thin on a flat portion 18 having a relatively small size and relatively thick on a flat portion 20 having a relatively large size or area. For example, PLOS (a silicone system resin produced by Fujitsu Limited) may be used as a heat resisting material, and may be deposited on the PSG layer 10 by spin-coating at 5000 rpm, and heated at 120° C. for 30 minutes to dry the coating layer. The dried coating layer having the thickness of approximately 0.5 micrometer is then heated at 300° C. for 30 minutes to change it to an $SiO_2$-like material.

The heat resisting material used for filling recesses or cavities and forming a substantially planar and smooth top surface may be an organic or inorganic material, such as organic or inorganic resins, including silicon system resins, polyimide resins, for example, PIQ (produced by Hitachi Kasei Kogyo K.K.) and Pyralin PI-2545, PI-2555 (produced by Du-Pont), photosensitive polyimides, heat resistant photoresists, and other resins.

Figure 1D:
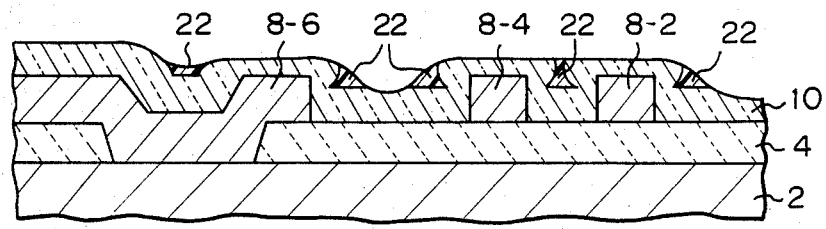

Referring to FIG. 1D, when the coating layer 16 is etched, the profile of the surface of the coating layer 16 is preserved during and after the etching so that the resultant surface after etching is substantially planar, as was the original surface of the coating layer 16 before etching. The coating layer 16 should be removed at least at portions where through holes are to be formed. This is necessary in order to prevent contact of the material of an upper wiring layer which is formed later with the heat resisting material such as a resin at the through-holes. Referring to FIG. 1C, a through-hole is to be formed at a thickest portion 20 of the coating layer 16. Therefore, etching should be carried out until the coating layer at the thickest portion 20 is completely removed. Further, the thickness of the lower insulating layer 10 under the thickest portion 20 of the coating layer may be reduced by etching. During such etching, thinner portions 18 of the resin layer 16 will be entirely removed and the underlying lower insulating layer 10 will be partially etched at those portions corresponding to the portions 18. The lower insulating layer 10 under the thinner portions 18 of the coating layer 16 is necessarily partially etched since the thicker portion 20 of the coating layer 16 must be etched completely. Therefore, in order to prevent the formation of steps at exposed-by-etching boundaries between the coating layer 16 and the lower insulating layer 10 due to differences in the etching rates thereof, the etching conditions should be selected so that the materials of the coating layer 16 and the lower insulating layer 10 are etched at nearly the same rates. Such a selection of conditions for etching allows preservation of the profile of the substantially planar top surface during and after etching.

After etching, the coating layer 16 may be substantially removed or may remain at some portions, but, in any case, the recesses or cavities 12 and 14 which may remain at least partially are filled with the remaining heat resisting material 22 of the coating layer 16. The remaining material 22 of the coating layer 16 in the recesses or cavities 12 and 14 is exposed but does not exist at portions where through-holes are to be formed.

The etching conditions mentioned above may be attained by many etching methods, including reactive ion etching, plasma etching, ion milling, etc. For example, where the coating layer 16 is PSG formed by CVD, and the lower insulating layer 10 is $SiO_2$-like material formed from PLOS, the conditions wherein a gas mixture of $CF_4$(130SCCM)+$CHF_3$(70SCCM), a pressure of 0.3 Torr, and a supply power of 600W in reactive ion etching are suitable to obtain nearly the same etching rates of those two materials. This etching is continued for approximately 2 to 3 minutes, leaving a lower insulating layer 10 having a thickness of approximately 200 nm to 300 nm under the portions 18 and a thickness of approximately 550 nm to 650 nm under the portion 20. The most suitable conditions for etching depend upon the materials of the coating layer 16 and the lower insulating layer 10.

Figure 1E:
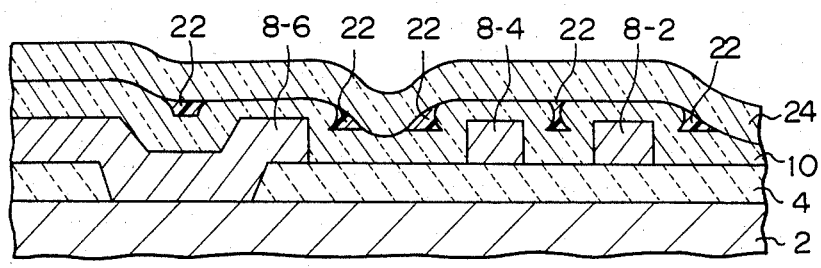

Referring to FIG. 1E, an upper insulating layer 24 is then formed on the lower insulating layer 10 and the remaining heat resisting material 22 in the recesses or cavities 12 and 14. This upper insulating layer 24 has a substantially planar top surface, due to the substantially planar top surface of the underlying layer on which the upper insulating layer 24 is formed. The upper insulating layer 24 may be made of the same material and by the same process as those used for the lower insulating layer 10. The thickness of the upper insulating layer 24 is not particularly limited.

Figure 1F:
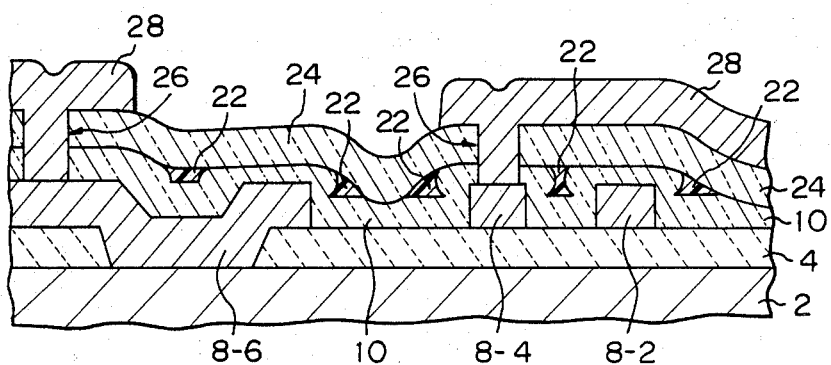

Referring to FIG. 1F, through-holes 26 are opened in the upper and lower insulating layers 24 and 10 and reach the lower wiring layer patterns 8-4 and 8-6. The through-holes may be formed by any conventional process. Then, an upper wiring layer 28 of given patterns is formed on the upper insulating layer 24 and in the through-holes 26 by any conventional process. The material of the upper wiring layer 28 may be the same as that of the lower wiring layer patterns 8-2, 8-4, and 8-6. As can be seen in FIG. 1F, there is no contact between the resultant upper wiring layer 28 and the heat resisting material 22 of the coating layer 16, even under the upper wiring layer 28 or in the through-holes 26. Further, no surface portions of the heat resisting material 22 or the coating layer 16 are exposed, which prevents any reaction between those materials and the chemicals or gases used in later procedures.

In the above example, the PLOS used for forming the coating layer 16 is heated at 300° C. before etching to change it to an $SiO_2$-like material. In such a case, however, the heat treatment used to change a starting material to a final material is preferably carried out after etching is finished. If the heat treatment is carried out before etching, cracks may appear due to contraction of the material caused by the change from a starting material to a final material. Heat treatment after etching prevents the formation of cracks in the heat resisting material remaining after etching, due to a reduced volume or thickness of the material. It should be noted, however, that the use of such a heat treatment to change a coating layer from a starting material to a final material is not always necessary in a process according to the present invention. In particular, in the present invention, materials which do not need such heat treatment may be used as an alternative material.

Figure 2:
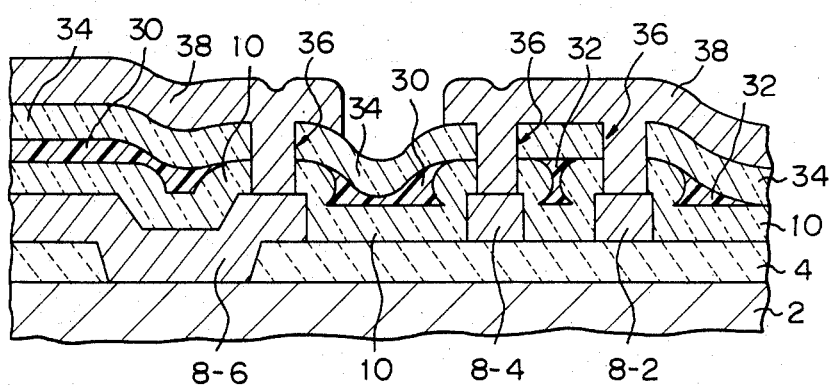
FIG. 2 is a partial sectional view of another semiconductor device fabricated by a process according to the present invention.

FIG. 2 illustrates another multilayer interconnection structure according to the present invention. As shown in FIG. 1C, if etching is stopped shortly after the relatively thinner portions 18 of the coating layer 16 are completely removed, the relatively thicker portion 20 of the coating layer 16 remains on the lower insulating layer 10. This is acceptable if no through-hole is to be formed at the portion 20 where a part 30 of the coating layer (FIG. 2) remains in the form of layer, although this is not necessary. In this case, the recesses or cavities 12 and 14 are filled with a heat resisting material 32, and an upper insulating layer 34, through-holes 36, and an upper wiring layer 38 of given patterns may be formed as in the preceding example.

Thus, according to the present invention, an upper wiring layer 28 or 38 can provide good coverage to an underlying insulating layer since the underlying insulating layer has a substantially planar and smooth top surface, preventing the many problems occurring because of insufficient coverage in multilayer interconnection structures, as mentioned previously. Further, the many problems resulting from a material such as an organic resin, e.g., a photoresist, being exposed or having contact with metal, etc. of a wiring layer, as in the prior art, can be also eliminated in a process according to the present invention.

In the above embodiments, a two wiring layer structure is illustrated, but the process according to the present invention is not limited thereto and may be applied to a multilayer interconnection structure having three or more wiring layers. In particular, an upper wiring layer as shown in the above embodiments may be considered to be a lower wiring layer, above which a further wiring layer can be formed according to a process similar to that described in the above embodiments.

We claim:

1. A process for fabricating a semiconductor device having substrate, comprising the steps of:
    (a) forming a lower wiring layer having pretermined patterns, on the substrate;
    (b) forming a lower insulating layer on the lower wiring layer and the substrate;
    (c) forming a coating layer of a heat resisting material on the lower insulating layer, the coating layer having a substantially planar surface and filling any cavities in the top surface of the lower insulating layer with the heat resisting material;
    (d) etching the entire surface of the coating layer until portions of the coating layer corresponding to at least a part of the lower wiring layer are completely removed to expose first portions of the lower insulating layer, whereby cavities remaining in the lower insulating layer after etching remain filled with the heat resisting material, and whereby the resultant top surface is substantially planar;
    (e) forming an upper insulating layer on the lower insulating layer and the remaining heat resisting material;
    (f) forming through-holes reaching the lower wiring layer at positions corresponding to the first portions of the lower insulating layer; and
    (g) forming an upper wiring layer having predetermined patterns on the upper insulating layer and in the through-holes, the upper wiring layer being electrically connected with the lower wiring layer via the through-holes.

2. A process according to claim 1, wherein steps (b) and (c) include forming the lower and upper insulating layers of a material selected from the group of silicon dioxide, phosphosilicate glass (PSG), silicon nitride, and silicon nitride oxide.

3. A process according to claim 1 or 2, wherein steps (b) and (c) include forming the lower and upper insulating layers by a method selected from the group of CVD, plasma CVD, sputtering, bias sputtering, and ion plating.

4. A process according to claim 1, wherein step (c) includes forming the coating layer of a heat resisting material selected from the group of silicon system resin, photosensitive polyimide, and heat resisting resist.

5. A process according to claim 1, wherein step (c) includes forming the coating layer by spin coating.

6. A process according to claim 1, wherein step (c) includes the substeps of:
  (1) coating a starting material on the lower wiring layer and the exposed substrate; and
  (2) heating the resultant layer of the starting material to cause it to change into a final material.

7. A process according to claim 6, wherein step (c) (1) includes forming the starting material of a silicon system resin so that the final material is a silicon dioxide-like material.

8. A process according to claim 6 or 7, wherein step (c) (2) is performed before step (d).

9. A process according to claim 6 or 7, wherein step (c) (2) is performed after step (d) and before step (e).

10. A process according to claim 1, wherein step (d) includes etching the coating layer and a part of the lower insulating layer with substantially the same etching rates.

11. A process according to claim 10, wherein step (d) includes etching by a method selected from the group of controlled etching, ion milling, and plasma etching.

12. A process according to claim 1, further comprising the steps of:
  (h) forming an additional wiring layer on the substrate; and
  (i) forming an insulating layer on the additional wiring layer before step (a).

13. A process according to claim 12, wherein step (i) includes performing steps corresponding to steps (a)–(g).

14. A process according to claim 1, wherein adjacent patterns of the wiring layer are separated by a space and wherein step (b) includes forming the lower insulating layer to a thickness which is less than half of the smallest space between adjacent patterns of the lower wiring layer.

15. A process according to claim 1, wherein step (a) includes forming the lower wiring layer of patterns having different widths.

16. A process according to claim 1, wherein step (a) includes forming the lower wiring layer of a material selected from the group of metal and polysilicon.

17. A process according to claim 1, wherein step (g) includes forming the upper wiring layer of a material selected from the group of metal and polysilicon.

* * * * *